United States Patent
Kobayashi et al.

(10) Patent No.: US 12,406,868 B2
(45) Date of Patent: Sep. 2, 2025

(54) OVERHEAD CONVEYING VEHICLE

(71) Applicant: Murata Machinery, Ltd., Kyoto (JP)

(72) Inventors: Makoto Kobayashi, Ise (JP); Yohei Matsumura, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 18/293,103

(22) PCT Filed: Mar. 30, 2022

(86) PCT No.: PCT/JP2022/016111
§ 371 (c)(1),
(2) Date: Jan. 29, 2024

(87) PCT Pub. No.: WO2023/013173
PCT Pub. Date: Feb. 9, 2023

(65) Prior Publication Data
US 2024/0375690 A1    Nov. 14, 2024

(30) Foreign Application Priority Data

Aug. 2, 2021    (JP) ................. 2021-126804

(51) Int. Cl.
*H01L 21/677* (2006.01)
*B61B 3/00* (2006.01)
(Continued)

(52) U.S. Cl.
CPC .......... *H01L 21/67733* (2013.01); *B61B 3/00* (2013.01); *B61B 13/06* (2013.01);
(Continued)

(58) Field of Classification Search
CPC ......... H01L 21/67706; H01L 21/67724; H01L 21/6773; H01L 21/67733; B65G 1/0457;
(Continued)

(56) References Cited

U.S. PATENT DOCUMENTS 5,685,227 A * 11/1997 Gaccetta ............... B66C 9/18
188/42
10,192,764 B2 * 1/2019 Kobayashi ........ H01L 21/68707
(Continued)

FOREIGN PATENT DOCUMENTS

| JP | 10-250978 | 9/1998 |
| JP | 2001-298065 | 10/2001 |
| JP | 2002-067935 | 3/2002 |

OTHER PUBLICATIONS

International Search Report dated Jun. 21, 2022, of counterpart International Application No. PCT/JP2022/016111, along with an English translation.

*Primary Examiner* — Gene O Crawford
*Assistant Examiner* — Keith R Campbell
(74) *Attorney, Agent, or Firm* — DLA Piper LLP (US)

(57) ABSTRACT

An overhead conveying vehicle in which a main body part holding a conveyed object is suspended and supported by a traveling part includes a base unit suspended by the traveling part, a horizontal shaft integrally provided with the base unit and extending in a horizontal direction, and a support part provided on the main body part and supporting the horizontal shaft via a rubber bush.

8 Claims, 11 Drawing Sheets

(51) Int. Cl.
  *B61B 13/06*     (2006.01)
  *B65G 1/04*      (2006.01)
  *B65G 47/61*     (2006.01)

(52) U.S. Cl.
  CPC ........... *B65G 1/0457* (2013.01); *B65G 47/61* (2013.01); *B65G 2201/0297* (2013.01)

(58) Field of Classification Search
  CPC .................... B65G 9/002; B65G 47/61; B65G 2201/0297; B61B 3/00; B61B 13/06
  See application file for complete search history.

(56) References Cited

U.S. PATENT DOCUMENTS 10,822,205 B2 * 11/2020 Kobayashi ............... B66C 11/00
11,515,186 B2 * 11/2022 Yuasa ............... H01L 21/67769

\* cited by examiner

OVERHEAD CONVEYING VEHICLE

TECHNICAL FIELD

This disclosure relates to an overhead conveying vehicle.

BACKGROUND

Japanese Unexamined Patent Publication No. 2001-298065 discloses an automated guided vehicle (AGV) including a cart, an AGV body placed on the cart via a damper for vibration isolation, and a transfer device provided to the AGV body. The AGV of Japanese Unexamined Patent Publication No. 2001-298065 can reduce vibrations transmitted to an article while traveling.

However, an overhead conveying vehicle with a structure in which the main body part holding an article (conveyed object) is suspended and supported by a traveling part cannot be configured to have the main body part placed on top of the traveling part via a damper for vibration isolation, as shown in Japanese Unexamined Patent Publication No. 2001-298065.

Therefore, it could be helpful to provide an overhead conveying vehicle capable of suppressing propagation of vibration from the traveling part to the conveyed object, even if the overhead conveying vehicle has a configuration in which the main body part holding the conveyed object is suspended and supported by the traveling part.

SUMMARY

We thus provide:

An overhead conveying vehicle is an overhead conveying vehicle in which a main body part holding a conveyed object is suspended and supported by a traveling part, and includes a base unit suspended by the traveling part, a horizontal shaft integrally provided with the base unit and extending in a horizontal direction, and a support part provided with the main body part and supporting the horizontal shaft via a rubber bush.

The horizontal shaft integrally configured in the base unit, which is suspended from the traveling part, is supported by the support part via the rubber bush. In other words, the traveling part and the main body part are connected via the rubber bush. With this configuration, vibration transmitted from the traveling part to the base unit is absorbed by the rubber bush. As a result, even an overhead conveying vehicle with a configuration in which a main body part holding a conveyed object is suspended and supported by a traveling part can suppress propagation of vibration from the traveling part to the conveyed object.

The horizontal shaft may be disposed to extend in a direction orthogonal to both a traveling direction of the traveling part and a vertical direction. In this configuration, when an angular change of the traveling part is allowed with respect to the main body part, the angular change of the traveling part is allowed only in the traveling direction of the traveling part so that tilting of the main body part can be minimized when the conveyed object is transferred in a right-and-left direction (lateral direction) perpendicular to the traveling direction.

A plurality of the horizontal shafts may be provided. In this configuration, a relative positional relationship between the traveling part and the main body part (posture of the main body part with respect to the traveling part) can be maintained more stably.

Only one piece of the horizontal shaft may be provided, and the overhead conveying vehicle may further include a pair of dampers provided in the base unit in a manner of sandwiching the horizontal shaft in the traveling direction of the traveling part and configured to contact the main body part. In this configuration, not only the propagation of vibration can be suppressed but also the vibration can be damped in an early stage. Furthermore, in this configuration, the relative positional relationship between the main body part and the traveling part can be maintained more stably.

The base unit may be suspended by the traveling part via a pair of suspension members extending downward in the vertical direction from the traveling part, and the base unit may rotatably support each of the suspension members around an axis as a turning axis that extends in an extending direction of the suspension members. With this configuration, in the suspension member, it is possible to reduce occurrence of torsional stress between an attachment portion to the traveling part and an attachment portion to the base unit.

An overhead conveying vehicle with a configuration in which a main body part holding a conveyed object is suspended and supported by a traveling part can suppress propagation of vibration from the traveling part to the conveyed object.

REFERENCE SIGNS LIST

Figure 1:
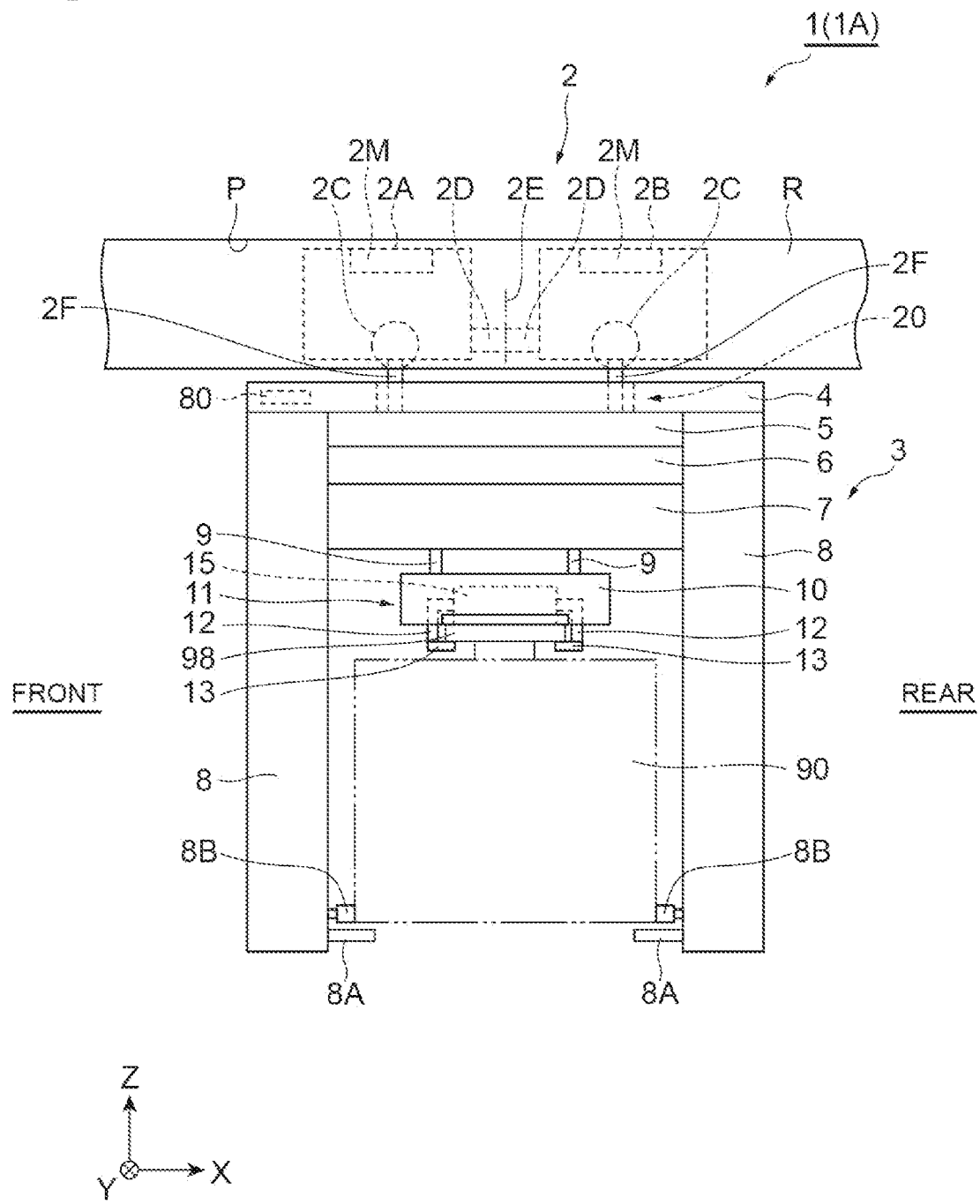
FIG. 1 is a side view of an overhead conveying vehicle according to a first example when viewed from side.

1, 1A overhead conveying vehicle
2 traveling part
2F suspension member
3 main body part
4 main body frame
20 vibration isolation unit
21 support part
23 base unit
28 horizontal shaft
29 rubber bush
90 conveyed object 120 vibration isolation unit
121 support part
123 base unit
126 horizontal shaft
127 rubber bush
130 damper
131 rubber member
132 spring member
133 contact part
R traveling rail

DETAILED DESCRIPTION

An overhead conveying vehicle 1 according to an example will now be described with reference to the drawings. In the description of the drawings, like elements are designated by like reference signs, and duplicate description is omitted.

First Example

An overhead conveying vehicle 1 according to a First Example will now be described. The overhead conveying vehicle 1 illustrated in FIG. 1 travels along a traveling rail R installed at a position higher than a floor such as on a ceiling of a clean room. The overhead conveying vehicle 1 transports a conveyed object 90 between a storage facility and a predetermined load port, for example. Examples of the conveyed object 90 include containers such as a front opening unified pod (FOUP) that store a plurality of semiconductor wafers and reticle pods that store glass substrates, and general components and the like. The containers described above have a flange 98 to be held by the overhead conveying vehicle 1.

In the following description, for convenience of explanation, the right-and-left direction (X-axis direction) in FIG. 1 is defined as "front-and-rear direction" (second direction) of the overhead conveying vehicle 1. The up-and-down direction (Z-axis direction) in FIG. 1 is defined as an up-and-down direction (vertical direction) of the overhead conveying vehicle 1. A depth direction (Y-axis direction) in FIG. 1 is defined as a right-and-left direction or a width direction (first direction) of the overhead conveying vehicle 1. The X-axis, the Y-axis, and the Z-axis are orthogonal to each other.

Figure 2:
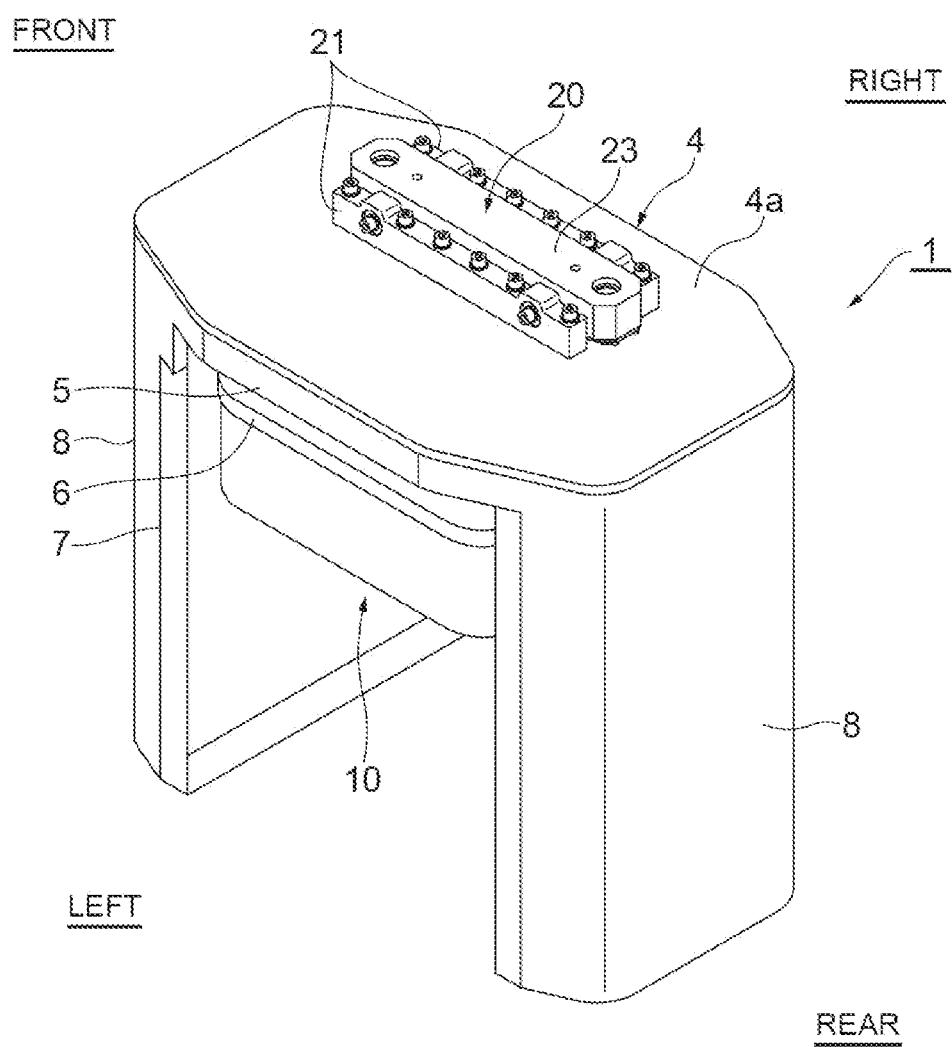
FIG. 2 is a perspective view of a main body frame of the overhead conveying vehicle of FIG. 1 when viewed from obliquely above.
Figure 3:
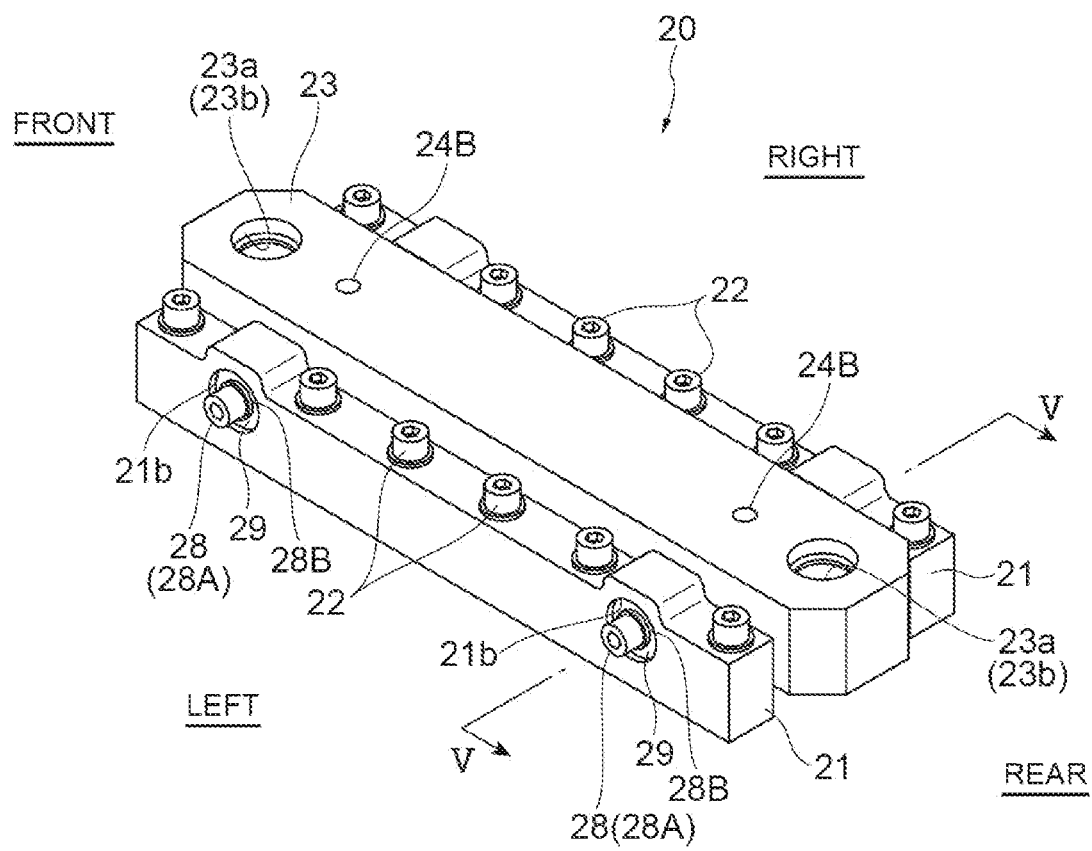
FIG. 3 is a perspective view of a vibration isolation unit when viewed from obliquely above.
Figure 4:
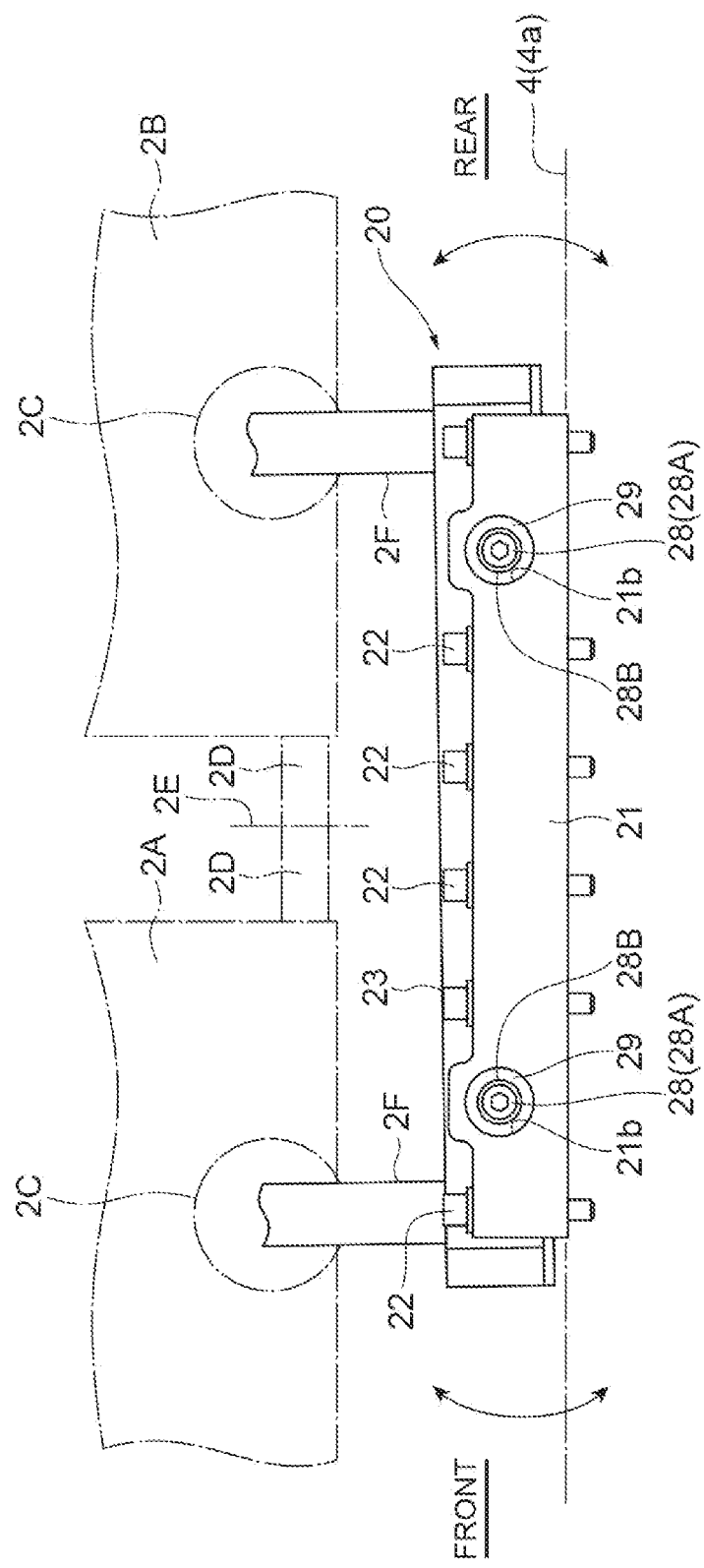
FIG. 4 is a side view of the vibration isolation unit when viewed from side.
Figure 5:
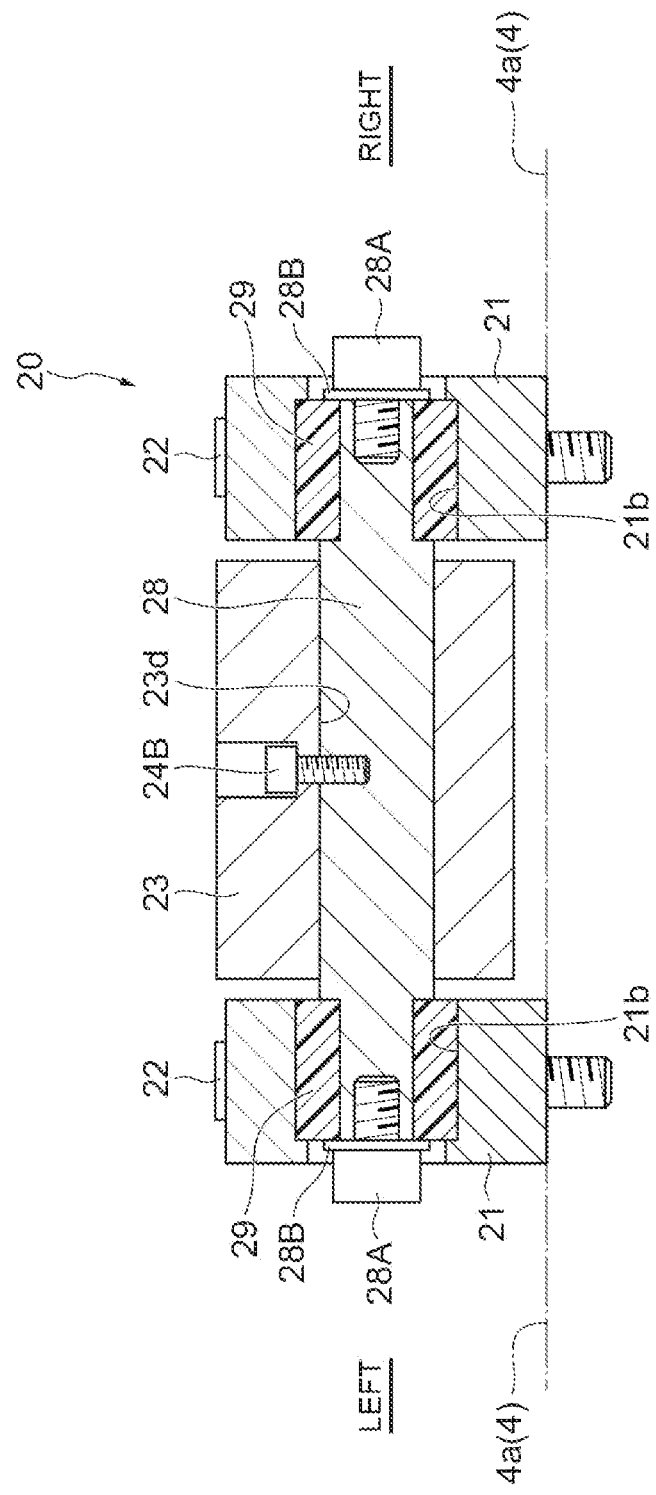
FIG. 5 is a schematic plan view when viewed from a line V-V of FIG. 3.
Figure 6:
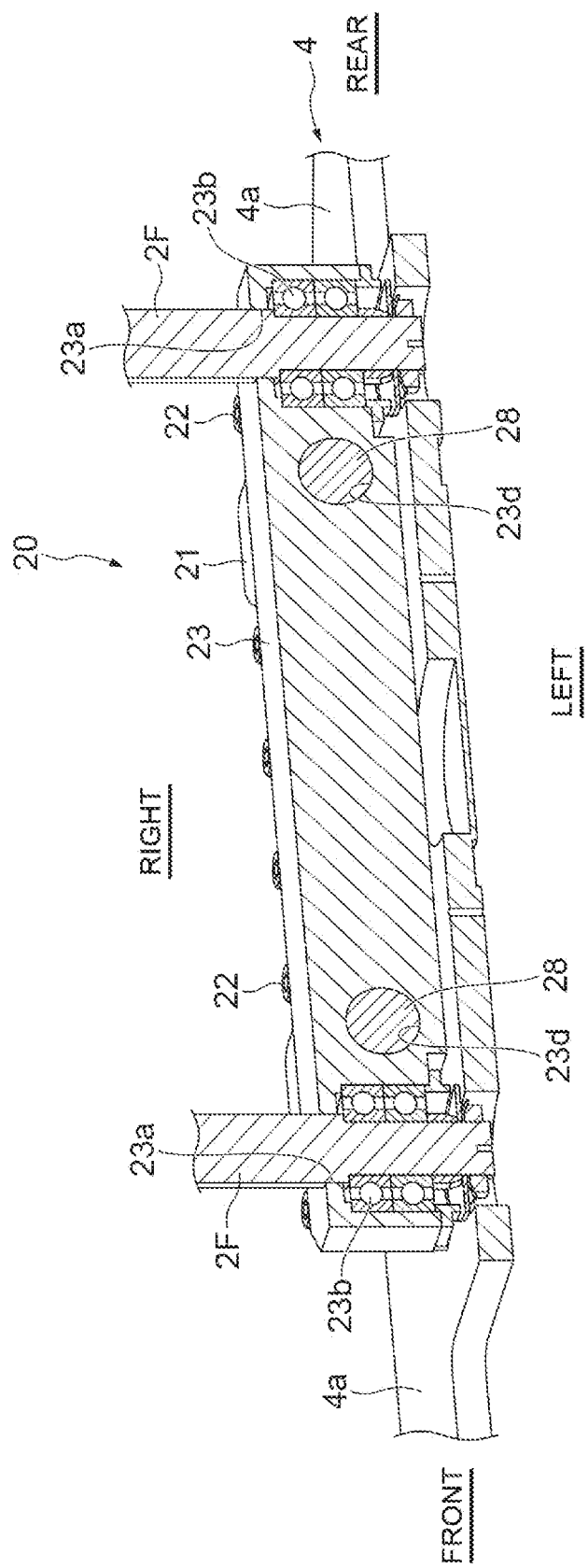
FIG. 6 is a sectional view of the vibration isolation unit cut along a front-and-rear direction.
Figure 7:
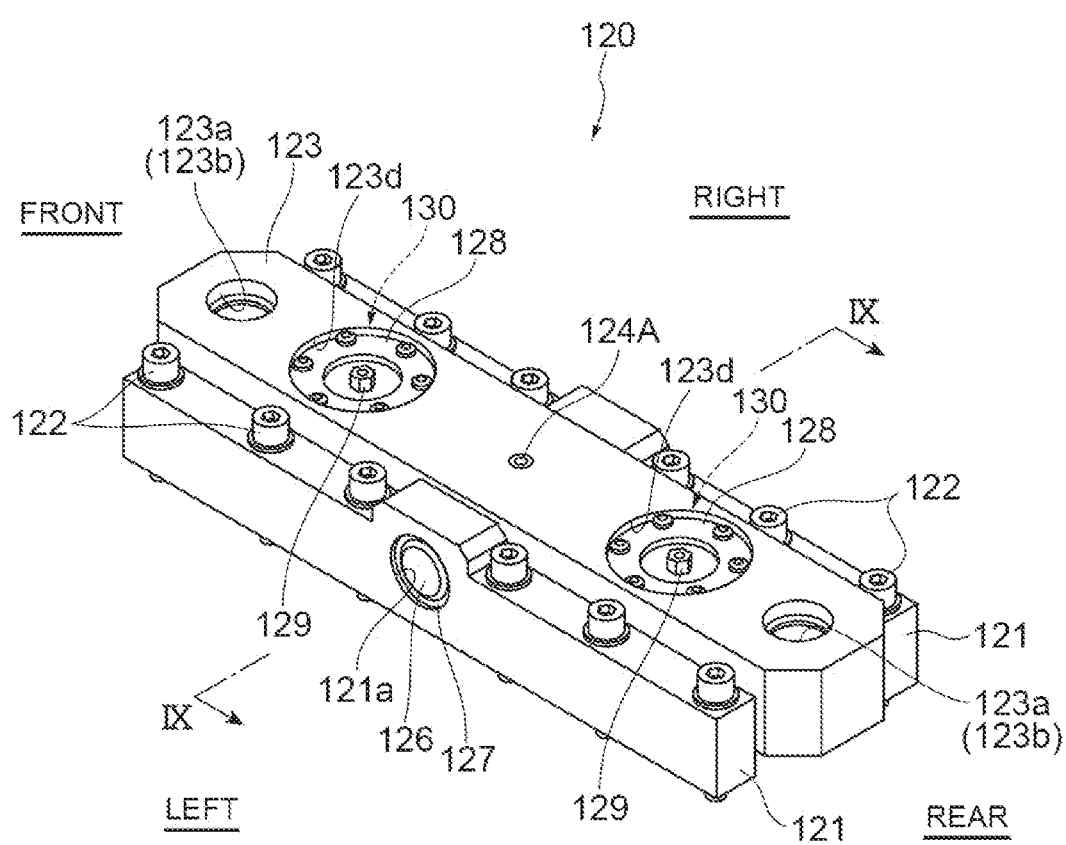
FIG. 7 is a perspective view of a vibration isolation unit according to a second example when viewed from obliquely above.
Figure 8:
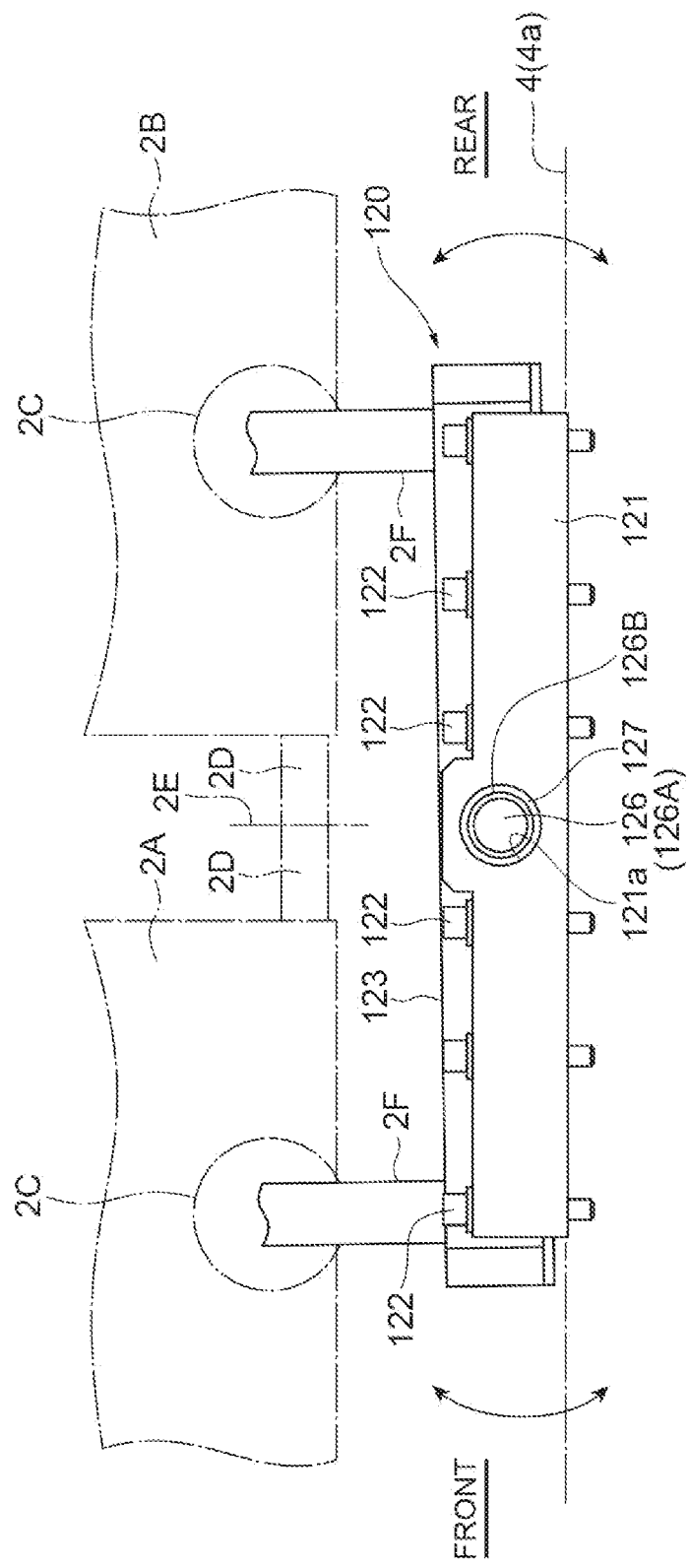
FIG. 8 is a side view of the vibration isolation unit according to the second example when viewed from side.
Figure 9:
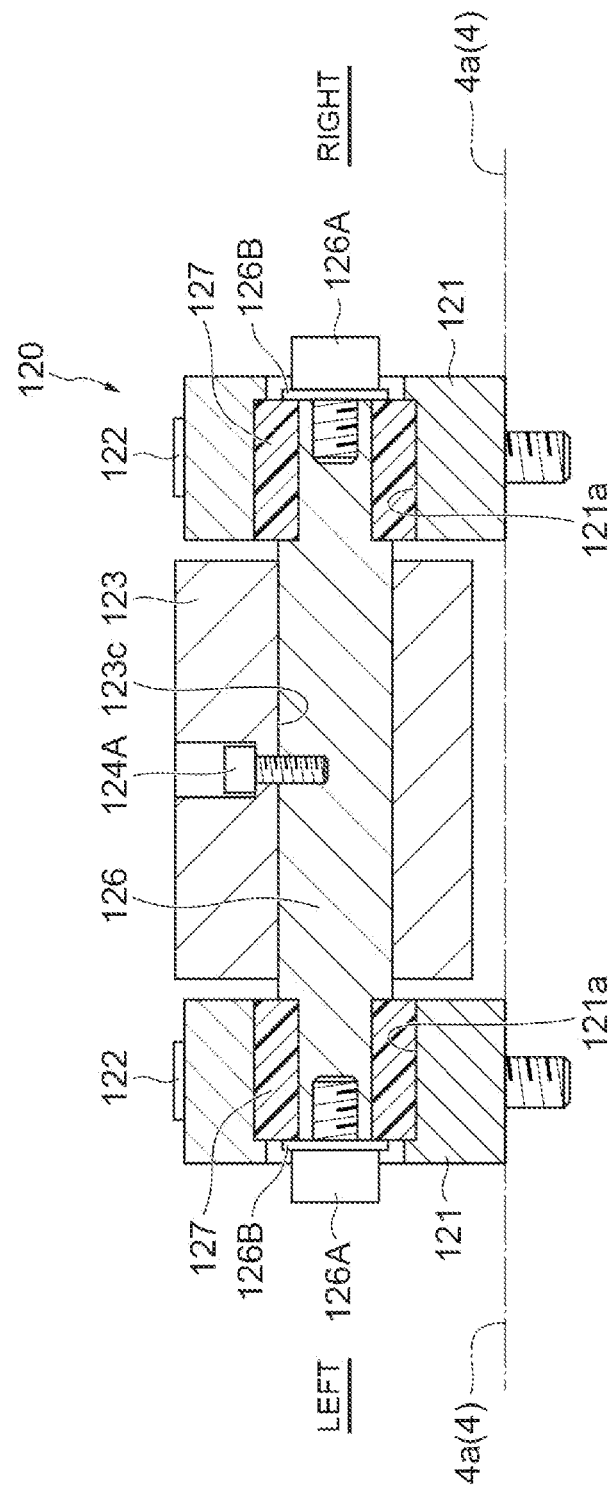
FIG. 9 is a schematic plan view when viewed from a line IX-IX of FIG. 7.
Figure 10:
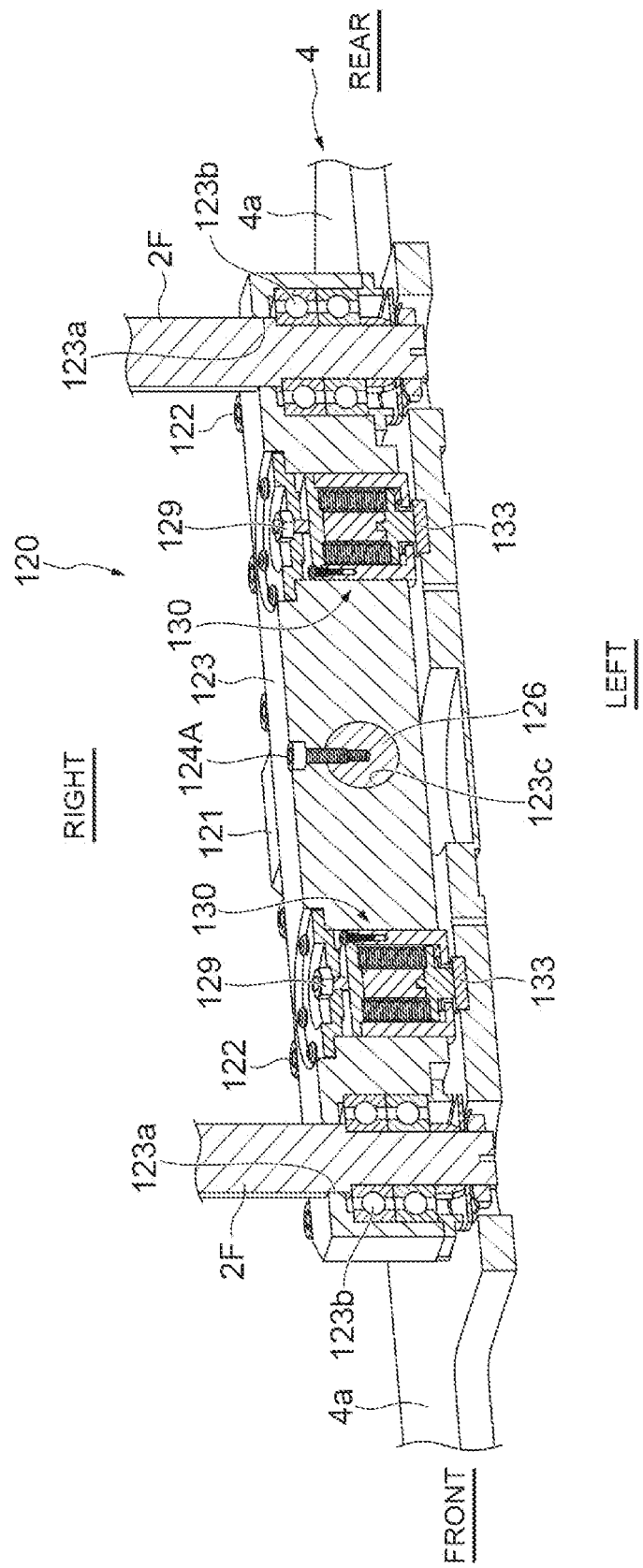
FIG. 10 is a sectional view of the vibration isolation unit according to the second example cut along a front-and-rear direction.

As illustrated in FIGS. 1 and 2, the overhead conveying vehicle 1 includes a traveling part 2, a main body part 3, and a lifting part 10. The traveling part 2 moves the overhead conveying vehicle 1 along the traveling rail R. The traveling part 2 is disposed inside the traveling rail R.

The traveling part 2 has a front traveling body 2A and a rear traveling body 2B. A connection part 2D provided on the front traveling body 2A and a connection part 2D provided on the rear traveling body 2B are rotatably connected by a connection shaft 2E. The front traveling body 2A and the rear traveling body 2B are provided with respective traveling rollers 2C, 2C and respective traveling drive parts 2M, 2M. The traveling drive part 2M is an LDM (Linear DC Motor) that accelerates or brakes the overhead conveying vehicle 1 by magnetic force generated between the LDM and a magnetic plate P disposed on a top surface of the traveling rail R.

The main body part 3 is suspended and supported by the traveling part 2. More precisely, the main body part 3 is suspended and supported by the traveling part 2 when a pair of suspension members 2F, 2F extending downward in the vertical direction from the traveling part 2 are connected to a vibration isolation unit 20 provided in a main frame 4 of the main body part 3. Details of the vibration isolation unit 20 are described in detail in a later section. The main body part 3 has a main frame 4, a horizontal drive part 5, a rotary drive part 6, a lifting drive part 7, a lifting part 10, a pair of covers 8, 8, and a controller 80.

The horizontal drive part 5 is fixed to a lower part of the main frame 4. The horizontal drive part 5 moves the rotary drive part 6, the lifting drive part 7, and the lifting part 10 in a direction orthogonal to the extending direction of the traveling rail R (right-and-left direction) in a horizontal plane. The rotary drive part 6 rotates the lifting drive part 7 and the lifting part 10 in the horizontal plane. The lifting drive part 7 raises and lowers the lifting part 10 by winding and paying out four belts 9. As the belts 9 in the lifting drive part 7, appropriate suspending members such as wires or ropes may be used.

The lifting part 10 is provided to be able to be raised and lowered by the lifting drive part 7, and functions as a lifting platform in the overhead conveying vehicle 1. The lifting part 10 includes a holding device 11 configured to grip the conveyed object 90, and is raised and lowered by the belts 9 with respect to the horizontal drive part 5, the rotary drive part 6, and the lifting drive part 7 included in the main body part. The holding device 11 holds the conveyed object 90. The holding device 11 includes a pair of arms 12, 12 formed in a L shape, hook parts 13, 13 fixed to the respective arms 12, 12, and an opening/closing mechanism 15 configured to open and close the pair of arms 12, 12.

The opening/closing mechanism 15 moves the pair of arms 12, 12 in a direction coming closer to each other and in a direction separating apart from each other. The pair of arms 12, 12 are moved forward and backward in the front-and-rear direction in accordance with an operation of the opening/closing mechanism 15. By this movement, the pair of hook parts 13, 13 fixed to the arms 12, 12 are opened and closed.

In the First Example, a height position of the holding device 11 (the lifting part 10) is adjusted (lowered) so that the holding surface of each hook part 13 is positioned lower than the height of the lower surface of the flange 98 when the pair of hook parts 13, 13 are in an open state. In this state, when the pair of hook parts 13, 13 are brought into a closed state, the holding surfaces of the hook parts 13, 13 are moved forward below the lower surface of the flange 98, and the lifting part 10 is raised in this state so that the flange 98 is held (gripped) by the pair of hook parts 13, 13, and the conveyed object 90 is supported.

The pair of covers 8, 8 are provided on the front and the rear of the traveling direction to cover the horizontal drive part 5, the rotary drive part 6, the lifting drive part 7, the lifting part 10, and the holding device 11. The pair of covers 8, 8 form a space for accommodating the conveyed object 90 below the holding device 11 in a state in which the lifting part 10 has ascended to its ascending end. Each of the paired covers 8, 8 has a drop prevention mechanism 8A and a swaying suppression mechanism 8B. The drop prevention mechanism 8A prevents the conveyed object 90 held by the holding device 11 from falling in the state in which the lifting part 10 has ascended to its ascending end. The swaying suppression mechanism 8B suppresses swaying of the conveyed object 90 held by the holding device 11 in the front-and-rear direction (traveling direction) and the right-and-left direction of the overhead conveying vehicle 1 during traveling.

The controller 80 is an electronic control unit including a central processing unit (CPU), a read only memory (ROM), a random access memory (RAM) and the like. The controller 80 controls various operations of the overhead conveying vehicle 1. Specifically, the controller 80 controls the traveling part 2, the horizontal drive part 5, the rotary drive part 6, and the lifting drive part 7. The controller 80 can be configured as software, for example, in which a program stored in the ROM is loaded onto the RAM and executed by the CPU. The controller 80 may be configured as hardware including electronic circuitry or the like. The controller 80 communicates with a higher-level controller (not illustrated) using a power feeding part (power feeding line) or a feeder line on the traveling rail R.

The following describes a vibration isolation unit 20 with reference to FIGS. 3 to 6. The vibration isolation unit 20 includes a pair of support parts 21, 21, a base unit 23, and a pair of horizontal shafts 28, 28.

The pair of support parts 21, 21 are arranged spaced apart in the right-and-left direction and are fixed to a top surface 4a of the main frame 4. The pair of support parts 21, 21 are fixed to the main frame 4 by members such as screws 22, for example. The pair of horizontal shafts 28, 28 extending horizontally in the right- and left direction are crossed over the pair of support parts 21, 21. More precisely, the pair of support parts 21, 21 respectively have insertion holes 21b, 21b formed therein through which the pair of horizontal shafts 28, 28 are respectively inserted. The insertion holes 21b, 21b are formed at both ends of the base unit 23 in the front-and-rear direction. A rubber bush 29 of a cylindrical shape is interposed in the insertion hole 21b, and the horizontal shaft 28 is interposed in the rubber bush 29. In other words, the horizontal shaft 28 is supported by the pair of support parts 21 via the rubber bush 29. The rubber bush 29 is formed by a material such as nitrile rubber, for example. At both ends of the horizontal shaft 28 in the extension direction, there are bolts 28A and washers 28B that act as detents from the insertion holes 21b.

The rubber bushes 29, 29, which are respectively interposed in the pair of support parts 21, 21 may be formed by materials of different hardness from each other. For example, the left and the right rubber bushes 29, 29 that are made different in hardness from each other can easily maintain the relative position (posture) of a main body part 3 with respect to the traveling part 2 when a position of the center of gravity of the vibration isolation unit 20 and that of the main body part 3 viewed from the Z-axis direction differ from each other, or when the conveyed object 90 is transferred in the right-and-left direction (lateral direction).

The base unit 23 is suspended from the traveling part 2 via the pair of suspension members 2F, 2F. The base unit 23 is a member extending in the front-and-rear direction. The base unit 23 has insertion holes 23a, 23a formed therein through which the pair of suspension members 2F, 2F can be inserted, respectively. The insertion holes 23a, 23a are formed at both ends of the base unit 23 in the front-and-rear direction. Moreover, an inner circumferential surface of the insertion hole 23a is provided with a bearing 23b that rotatably supports the suspension member 2F around an axis along the extending direction of the suspension member 2F.

The base unit 23 is provided to not be rotatable with respect to the turning shaft 26. More precisely, the turning shaft 26 is inserted into an insertion hole 23d formed in the base unit 23, and the turning shaft 26 and the base unit 23 are fixed by a screw 24B. Insertion holes 23d, 23d are provided at both ends of the base unit 23 in the front-and-rear direction. In other words, the two horizontal shafts 28, 28 are provided on the base unit 23 in an unrotatable manner.

The base unit 23 is supported by the pair of support parts 21, 21 via the horizontal shafts 28, 28.

The following describes a working effect of the overhead conveying vehicle 1 described above. In the overhead conveying vehicle 1 described above, the horizontal shaft 28 that is integrally configured in the base unit 23 suspended from the traveling part 2 is supported by the support part 21 via the rubber bush 29. In other words, the traveling part 2 and the main body part 3 are connected via the rubber bush 29. As a result, the vibration transmitted from the traveling part 2 to the base unit 23 is absorbed by the rubber bush 29. As a result, even if the overhead conveying vehicle 1 has a configuration in which the main body part 3 holding the conveyed object 90 is suspended and supported by the traveling part 2, vibration from the traveling part 2 can be suppressed from propagating to the conveyed object 90.

In the overhead conveying vehicle 1 described above, the horizontal shaft 28 is disposed to extend in a direction orthogonal to both the traveling direction and the vertical direction of the traveling part 2 (right-and-left direction). With this configuration, when an angular change of the traveling part 2 is allowed with respect to the main body part 3, the angular change of the traveling part is allowed only in the traveling direction of the traveling part 2 so that tilting of the main body part 3 can be minimized when the conveyed object 90 is transferred in a right-and-left direction (lateral direction) perpendicular to the traveling direction.

In the overhead conveying vehicle 1 described above, since two horizontal shafts are provided, the relative positional relationship between the main body part 3 and the traveling part 2 (posture of the main body part 3 with respect to the traveling part 2) can be maintained more stably.

In the overhead conveying vehicle 1 described above, the base unit 23 rotatably supports each of suspension members 2F, 2F around an axis as a turning axis that extend in an extending direction of the suspension members 2F, 2F, thereby reducing the occurrence of torsional stress between the attachment portion to the traveling part 2 and the attachment portion to the base unit 23 in the suspension members 2F, 2F.

Second Example

An overhead conveying vehicle 1A according to a Second Example will now be described mainly with reference to the FIG. 1, and FIGS. 7 to 11. In the overhead conveying vehicle 1A according to the Second Example, the configuration of a vibration isolation unit 120 differs from that of the vibration isolation unit 20 of the overhead transfer vehicle 1 of the First Example. The vibration isolation units 120 the configurations of which differ from each other are described in detail, and description of the other configurations is omitted. The vibration isolation unit 120 includes a pair of support parts 121, 121, a base unit 123, and a pair of dampers 130, 130.

The pair of support parts 121, 121 are arranged spaced apart in the right-and-left direction and are fixed to a top surface 4a of the main frame 4. The pair of support parts 121, 121 are fixed to the main frame 4 by members such as screws 122, for example. A turning shaft 126 extending horizontally in the right- and left direction is crossed over the pair of support parts 121, 121. More precisely, each of the paired support parts 121, 121 has an insertion hole 121a formed therein through which the turning shaft 126 is inserted. A horizontal shaft 126 is attached to the support parts 121, 121 via bolts 126A and washers 126B provided at both ends of the horizontal shaft 126. A resin bush 127 of a cylindrical shape is interpolated in the insertion hole 121a, and the turning shaft 126 is interposed in the resin bush 127. In other words, the turning shaft 126 is supported by the pair of support parts 121, 121 with the resin bushes 127. The rubber bush 127 is formed by a material such as nitrile rubber, for example. The horizontal shaft 126 is disposed in substantially the center of a main body frame 4 in the front-and-rear direction.

The base unit 123 is suspended from the traveling part 2 via the pair of suspension members 2F, 2F. The base unit 123 is a member extending in the front-and-rear direction. The base unit 123 has insertion holes 123a, 123a formed therein through which the pair of suspension members 2F, 2F can be inserted, respectively. The insertion holes 123a, 123a are formed at both ends of the base unit 123 in the front-and-rear direction. Moreover, an inner circumferential surface of the insertion hole 123a is provided with a bearing 123b that rotatably supports the suspension member 2F around an axis along the extending direction of the suspension member 2F.

The base unit 123 is provided to not be rotatable with respect to the turning shaft 126. More precisely, the turning shaft 126 is inserted into an insertion hole 123c formed in the base unit 123, and the turning shaft 126 and the base unit 123 are fixed by a screw 124A. The base unit 123 is supported by the pair of support parts 121, 121 in a rotatable state via the turning shaft 126 extending in the horizontal direction. In other words, the pair of support parts 121, 121 rotatably support the turning shaft 126 that rotates integrally with the base unit 123.

The pair of dampers 130, 130 are provided to sandwich the turning shaft 126 in the front-and-rear direction and to come into contact with the top surface 4a of the main frame 4. The damper 130 is interposed in an insertion hole 123d formed in the base unit 123, and is provided such that part of the damper 130 protrudes downward (to the top surface 4a of the main frame 4). The damper 130 absorbs energy generated when coming into contact with the top surface 4a of the main frame 4.

The damper 130 has a rubber member 131, a spring member 132, a contact part 133, a housing 134, and a buffer 135. The rubber member 131 has elasticity, and is formed of, for example, urethane rubber or other materials. The spring member 132 is disposed to have the rubber member 131 interposed therein. The elasticity of the spring member 132 may be greater than that of the rubber member 131. This allows the elasticity of the rubber member 131 to be added to the contact part 133 when the spring member 132 shrinks to some degree. The contact part 133 is a member that comes into contact with the top surface 4a of the main frame 4. A portion of the lower part of the contact part 133, the portion coming into contact with the top surface 4a of the main frame 4, is formed of a material having compression-resistance such as ultra-high molecular weight polyethylene. The upper part of the contact part 133 has a flange 133a formed therein that comes into contact with a lower end of the rubber member 131 and a lower end of the spring member 132. The spring member 132 of the Second Example comes into contact with the contact part 133 in a state of being compressed, that is, pressurization is applied thereto. The housing 134 accommodates the rubber member 131, the spring member 132, and part of the contact part 133. The buffer 135 is a resin bush provided to prevent wear due to vertical movement of the contact part 133.

The base unit 123 is provided with a lid 128 that covers an upper opening of the insertion hole 123d. The lid 128 is fixed to the base unit 123 by a screw 128A or other means. The center of the lid 128 is provided with an adjustment screw 129 to adjust an amount of push by the damper 130 onto the main frame 4 (the amount of protrusion of the contact part 133 from the base unit 123). A tip of the adjustment screw 129 is in contact with a top surface 134a of the housing 134. The amount of protrusion of the contact part 133 protruding from the lower surface of the base unit 123 can be adjusted by rotating the adjustment screw 129 with respect to the lid 128.

The following describes a working effect of the overhead conveying vehicle 1A according to the Second Example described above. In the overhead conveying vehicle 1A described above, the horizontal shaft 126 integrally configured in the base unit 123, which is suspended from the traveling part 2, is supported by the support part 121 via the rubber bush 127. In other words, the traveling part 2 and the main body part 3 are connected via the rubber bush 127. As a result, the vibration transmitted from the traveling part 2 to the base unit 123 is absorbed by the rubber bush 127. As a result, similar to the overhead conveying vehicle 1A according to the First Example described above, even if the overhead conveying vehicle 1A has a configuration in which the main body part 3 holding the conveyed object 90 is suspended and supported by the traveling part 2, the vibration from the traveling part 2 can be suppressed from propagating to the conveyed object 90.

The horizontal shaft 126 is disposed to extend in a direction orthogonal to both the traveling direction and the vertical direction of the traveling part 2 (right-and-left direction). With this configuration, when an angular change of the traveling part 2 is allowed with respect to the main body part 3, the angular change of the traveling part is allowed only in the traveling direction of the traveling part 2 so that tilting of the main body part 3 can be minimized when the conveyed object 90 is transferred in a right-and-left direction (lateral direction) perpendicular to the traveling direction.

In the overhead conveying vehicle 1A according to the Second Example described above, only one piece of the horizontal shaft 126 is provided. In the traveling direction of the traveling part 2, the pair of dampers 130, 130 are provided on the base unit 123 in a manner of sandwiching the horizontal shaft 126 and contacting the main body part 3. In this configuration, not only the propagation of vibration generated in the traveling part 2 to the main body part 3 can be suppressed, but also the vibration can be damped in an early stage. Furthermore, the relative positional relationship between the traveling part 2 and the main body part 3 (posture of the main body part 3 with respect to the traveling part 2) can be maintained more stably.

Figure 11:
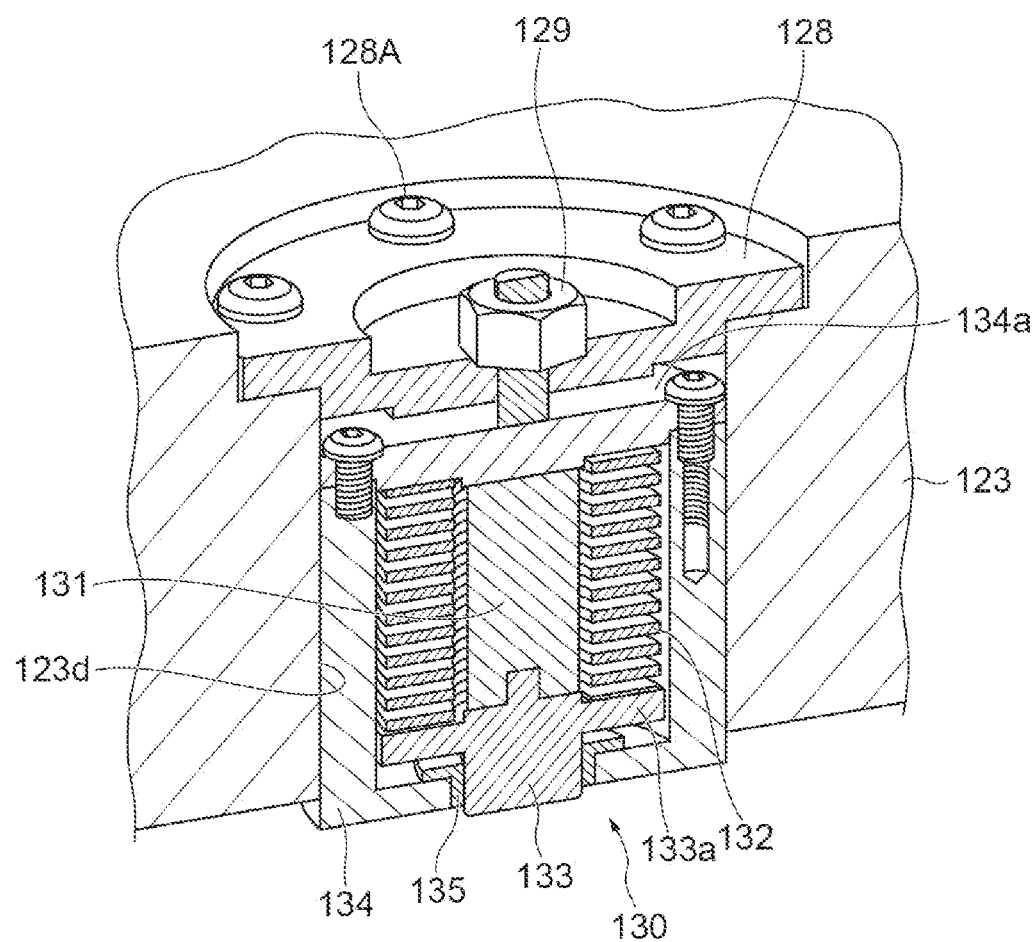
FIG. 11 is a sectional perspective view illustrating an inner structure of a damper of FIG. 10.

Since the damper 130 has the rubber member 131 and a spring member 132, as illustrated in FIG. 11, pressurization generated in the damper 130 can be easily adjusted by compressing the spring member 132. In the damper 130 of the second embodiment, a predetermined pressurization is applied. When both the traveling part 2 and the main body part 3 have no tilt, the contact part 133 of the damper 130 and the top surface 4a of the main frame 4 are in contact with each other in a state in which the contact part 133 does not exert any force on the main frame 4. The contact part 133 can be brought into contact with the top surface 4a of the main frame 4 by rotating the adjustment screw 129 to adjust the amount of protrusion of the contact part 133.

When the traveling part 2 accelerates forward, the base unit 123 in a freely rotatable state is subjected to force in a manner to sink frontward. However, in the damper 130 to which pressurization is applied, even if such force that causes the base unit 123 to sink frontward is applied, the spring member 132 and the rubber member 131 are not compressed until force exceeding a predetermined value (i.e., force exceeding the force applied to the spring member 132 as pressurization) is exerted, and the base unit 123 is not tilted against the main frame 4. In the damper 130 of the above Second Example, pressurization that can withstand the force generated by an assumed acceleration is set. With this configuration, occurrence of posture change of the main frame 4 can be suppressed during acceleration of the overhead conveying vehicle 1A. In other words, occurrence of swaying in the conveyed object 90 can be suppressed during acceleration of the overhead conveying vehicle 1A.

Since pressurization is applied to the dampers 130, 130 in both the front and the rear directions, the occurrence of the posture change of the main frame 4 can be suppressed also during deceleration of the overhead conveying vehicle 1A. In other words, since pressurization is set to withstand the force generated by assumed deceleration, occurrence of swaying of the conveyed object 90 can be suppressed during deceleration of the overhead conveying vehicle 1A.

The First Example and Second Example have been described above, but this disclosure is not limited to these examples. Various modifications can be made without departing from the appended claims.

In the First Example described above, a configuration is described in which the two horizontal shafts 28, 28 are provided, and in the Second Example described above, a configuration is described in which one horizontal shaft 126 is provided, but three or more horizontal shafts may be integrally installed with the base unit 23 (123).

In the examples and modifications described above, a configuration is described in which the base unit 23 is configured to be rotatable only in the front-and-rear direction, but the base unit 23 may be configured to be rotatable only in the right-and-left direction.

In the above examples and modifications described above, a configuration is described in which the traveling part 2 includes a front traveling body 2A and a rear traveling body 2B that are rotatable with each other, but the traveling part 2 may be formed from a single traveling body.

What is claimed is:

1. An overhead conveying vehicle in which a main body part having a main frame and a lifting part provided at a lower part of the main frame and configured to elevate a holding part holding a conveyed object is suspended and supported by a traveling part, the overhead conveying vehicle comprising:
   a base unit suspended by the traveling part;
   a horizontal shaft integrally provided with the base unit and extending in a horizontal direction; and
   a pair of support parts provided on the main frame and supporting the horizontal shaft via rubber bushes, wherein
   the main body part is suspended and supported by the traveling part via the base unit that is disposed between the traveling part and the main frame in a vertical direction, and the pair of support parts that are provided on a top surface of the main frame.

2. The overhead conveying vehicle according to claim 1, wherein the horizontal shaft is disposed to extend in a direction orthogonal to both a traveling direction of the traveling part and the vertical direction.

3. The overhead conveying vehicle according to claim 1, wherein
   a plurality of the horizontal shafts are arrayed along a direction orthogonal to both an extending direction of the horizontal shafts and the vertical direction, and
   the horizontal shafts are supported in an unrotatable manner with respect to the base unit and the pair of support parts.

4. The overhead conveying vehicle according to claim 1, wherein
   only one horizontal shaft is provided, and
   the overhead conveying vehicle further include a pair of dampers provided in the base unit in a manner of sandwiching the horizontal shaft in the traveling direction of the traveling part, and are configured to contact the top surface of the main frame.

5. The overhead conveying vehicle according to claim 1, wherein
   the base unit is suspended by the traveling part via a pair of suspension members extending downward in the vertical direction from the traveling part, and
   the base unit rotatably supports each of the suspension members around an axis as a turning axis that extends in an extending direction of the suspension members.

6. The overhead conveying vehicle according to claim 1, wherein the rubber bushes respectively provided in the pair of support parts are formed by materials of different hardness from each other.

7. The overhead conveying vehicle according to claim 2, wherein
   a plurality of the horizontal shafts are arrayed along a direction orthogonal to both an extending direction of the horizontal shafts and the vertical direction, and
   the horizontal shafts are supported in an unrotatable manner with respect to the base unit and the pair of support parts.

8. The overhead conveying vehicle according to claim 2, wherein
   only one horizontal shaft is provided, and
   the overhead conveying vehicle further include a pair of dampers provided in the base unit in a manner of sandwiching the horizontal shaft in the traveling direction of the traveling part, and are configured to contact the top surface of the main frame.

* * * * *